United States Patent
Kang

(10) Patent No.: US 7,113,438 B2
(45) Date of Patent: Sep. 26, 2006

(54) SEMICONDUCTOR MEMORY DEVICE AND CONNECTING METHOD OF SENSE AMPLIFIER

(75) Inventor: Khil Ohk Kang, Gyunggi-Do (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 0 days.

(21) Appl. No.: 11/031,499

(22) Filed: Jan. 7, 2005

(65) Prior Publication Data

US 2005/0174867 A1   Aug. 11, 2005

(30) Foreign Application Priority Data

Feb. 5, 2004   (KR) ............... 10-2004-0007580

(51) Int. Cl.
*G11C 7/06* (2006.01)
(52) U.S. Cl. ............... 365/208; 365/207; 365/230.03; 365/190
(58) Field of Classification Search ........... 365/230.03, 365/190, 207, 208
See application file for complete search history.

(56) References Cited

U.S. PATENT DOCUMENTS 5,764,572 A   6/1998   Hammick ............... 365/189.01
6,002,625 A * 12/1999 Ahn ............... 365/206
6,618,307 B1   9/2003   Wickman ............... 365/207
6,813,209 B1 * 11/2004 Crain et al. ............... 365/208

FOREIGN PATENT DOCUMENTS

KR   10-1998-039474   8/1998
KR   10-2003-0094548   12/2003

* cited by examiner

*Primary Examiner*—Andrew Q. Tran
(74) *Attorney, Agent, or Firm*—Marshall, Gerstein & Borun LLP

(57) ABSTRACT

Disclosed are a connecting method of a sense amplifier and a semiconductor memory device using the same. The semiconductor memory device comprises a memory cell array including a plurality of word lines connected respectively to a plurality of memory cell blocks, each of which is composed of a plurality of memory cells, in a row direction of the memory cells, and a plurality of pairs of bit lines connected respectively to the plurality of memory cell blocks in a column direction of the memory cells; and a plurality of sense amplifier arrays, each of which includes a plurality of sense amplifiers, each of which is connected to bit lines and complementary bit lines of the plurality of pairs of bit lines, for sensing a potential difference between the bit lines and the complementary bit lines.

12 Claims, 4 Drawing Sheets

SEMICONDUCTOR MEMORY DEVICE AND CONNECTING METHOD OF SENSE AMPLIFIER

This application relies for priority upon Korean Patent Application No. 2004-7580 filed on Feb. 5, 2004, the contents of which are herein incorporated by reference in their entirety.

BACKGROUND OF THE INVENTION

1. Field of the Invention

The present invention relates to a semiconductor memory device and a connecting method of a sense amplifier, and more particularly to a connecting method of a sense amplifier, which is capable of achieving high integration of a semiconductor memory device by optimizing a method of connecting bit lines and complementary bit lines of a memory cell array to the sense amplifier, and a semiconductor memory device using the same.

2. Description of the Related Art

With the development of computer systems and electronic communications, volatile semiconductor memory chips used for storage of information have become low-priced, miniaturized, and increased in their capacity. Particularly, the miniaturization of the memory chips has provided a basis of techniques for implementation of mass storage.

Recently, in addition to techniques for reducing the size of memory chips by optimizing the size and arrangement of memory cells, studies of miniaturization of the memory chips by simplifying peripheral circuits of the memory chips and reducing the number of signal lines have been actively conducted. The present invention has been conceived in view of these technical trends.

In general, a cell block for storing data of a dynamic random access memory (DRAM) device has a structure where a number of cells, each of which is composed of one n-type metal oxide silicon (NMOS) transistor and one capacitor, are respectively connected to word lines and bit lines, which are connected to each other in the form of matrix.

Hereinafter, operation of a general DRAM device will be briefly described.

First, when a /RAS signal, which is a main signal for operating the DRAM device, goes into an active state (low level), address signals are inputted to a row address buffer. Thereafter, the inputted address signals are decoded and a row decoding operation for selecting one of the word lines in the cell block is performed based on the decoded address signals.

At this time, when data of cells connected to the selected word line is loaded on a pair of bit lines BL and /BL, which is composed of a bit line and a complementary bit line, a signal indicating a time-point of operation of a sense amplifier is enabled to drive a sense amplifier driving circuit in a cell block selected by the address signal. In addition, sense amplifier bias potentials are shifted to a core potential Vcore and a ground potential Vss, respectively, to drive the sense amplifier. When the sense amplifier begins to be operated, a minute potential difference which is being maintained by the pair of bit lines BL and /BL is shifted to a large potential difference, and thereafter, a column decoder selected by a column address turns on a column transfer transistor for transferring data loaded on the pair of bit lines BL and /BL to a pair of data bus lines DB and /DB through which the data is outputted to the outside of the DRAM device.

More specifically, in the operation as described above, the pair of bit lines BL and /BL is pre-charged to ½ Vcc in a standby mode before the DRAM device begins to be operated. Thereafter, when the DRAM device is operated, data of the cells is loaded on the pair of bit lines BL and /BL. Accordingly, the pair of bit lines BL and /BL has a minute potential difference there between. In this state, when the sense amplifier begins to be operated to amplify potentials of the pair of bit lines BL and /BL, such that the pair of bit lines BL and /BL which maintain the minute potential difference there between has the core potential Vcore and the ground potential Vss, respectively. Data on the pair of bit lines BL and /BL having the amplified potentials, i.e., the potential Vcore and the ground potential Vss, is transferred to the pair of data bus lines DB and /DB.

Hereinafter, a conventional connecting method of the sense amplifier, operation of the sense amplifier, and related problems will be described with reference to FIG. 1.

In general, the semiconductor memory device, particularly, the DRAM, includes a memory cell array including a plurality of word lines xWLy connected respectively to a plurality of memory cell blocks, each of which is composed of a plurality of memory cells, in a row direction of the memory cells, and a plurality of pairs of bit lines, each of which is composed of a bit line xBLy and a complementary bit line x/Bly, connected respectively to the plurality of memory cell blocks in a column direction of the memory cells; and a plurality of sense amplifier arrays, each of which includes a plurality of sense amplifiers xSAy, each of which is connected to the bit line xBLy and the complementary bit line x/BLy, for sensing a potential difference between the bit line xBLy and the complementary bit line x/Bly.

Where, 'x' and 'y' are random numbers, 'x' in the word lines xWLy indicates an x-th memory cell block from top to bottom of the memory cell arrays, 'y' in the word lines xWLy indicates a word line at a y-th row from top of bottom of the memory cell blocks, 'x' in the bit line xBLy and the bit line x/BLy indicates an x-th memory cell block from top to bottom of the memory cell arrays, and 'y' in the bit line xBLy and the bit line x/BLy indicates a bit line or a complementary bit line at a y-th column from left to right of the memory cell blocks. In addition, 'x' in the sense amplifiers xSAy indicates a sense amplifier of an x-th sense amplifier array from top to bottom of the memory cell arrays, and 'y' in the sense amplifier xSAy indicates a y-th sense amplifier from left to right of the sense amplifier arrays.

As shown in FIG. 1, in the conventional semiconductor memory device, the sense amplifiers are connected to the pairs of bit lines of respective memory cell blocks, which are adjacent above and below the sense amplifiers. For example, in FIG. 1, a sense amplifier 2SA1 is connected to a pair of bit lines 1BL2 and 1/BL2 of an adjacent upper memory cell block 100 and a pair of bit lines 2BL2 and 2/BL2 of an adjacent lower memory cell block 200.

FIG. 2 is a circuit diagram of a portion 10 indicated by a dotted line. Now, sensing and amplifying operation of the conventional sense amplifier will be described with reference to FIG. 2.

Referring to FIG. 2, if a voltage charge-shared by a bit line 1BL2 and a complementary bit line 1/BL2 is to be sensed, NMOSs N12 and N1/2, which are a switching device, are turned on by applying control signals bis12 and bis1/2 of high level to gate electrodes of the NMOSs N12 and N1/2, respectively, such that only the pair of bit lines is selected. At this time, other switching devices except the NMOSs N12 and N1/2 are turned off by applying control signals of low level to gate electrodes of other switching devices in order to prevent charges from being introduced from pairs of bit lines to other switching devices.

Next, a sense amplifier 2SA1 senses data of memory cells transferred to the pair of bit lines 1BL2 and 1/BL2 and amplifies the sensed data to full-logic level. More specifically, if a level of the data transferred from the bit line 1BL2 is sensed to have a high level, an NMOS N2 is turned on, and accordingly, a potential at a node B is shifted to a ground potential Vss. This ground potential Vss at the node B is applied to a gate of a PMOS P1, thus turning on the PMOS P1. Accordingly, a potential at a node A is shifted from a high level to a core potential Vcore level. On the contrary, if the level of the data transferred from the bit line 1BL2 is sensed to have a low level, a PMOS P2 is turned on, and accordingly, the potential at the node B is shifted to the core potential Vcore. This core potential Vcore at the node B is applied to a gate of an NMOS N1, thus turning on the NMOS N1. Accordingly, the potential at the node A is shifted from a low level to a ground potential Vss level.

In addition, if a voltage charge-shared by a pair of bit lines 2BL2 and 2/BL2 is to be sensed, NMOSs N22 and N2/2 are tuned on by applying control signals bis22 and bis2/2 of high level to gate electrodes of the NMOSs N22 and N2/2, and thereafter, the same operation as described above is performed.

However, the conventional connecting method of the sense amplifier and the semiconductor memory device using the same method have a problem of going against the technical trend toward high integration. Namely, since the conventional sense amplifier performs a sensing operation in charge of only adjacent upper and lower memory cell blocks, there is a problem in that a large number of sense amplifiers are required, and accordingly, an area occupied by sense amplifiers in a memory chip becomes large. Accordingly, as the overall size of the memory chip increases, there arises a problem of going against the trend of semiconductor memory techniques to accomplish low-price, high integration, and high-capacity semiconductor memory devices.

SUMMARY OF THE INVENTION

Therefore, it is an object of the present invention to provide a connecting method of a sense amplifier and a semiconductor memory device using the same, which is capable of achieving high integration of the semiconductor memory device by increasing the number of bit lines and complementary bit lines allocated to the sense amplifier, and accordingly, reducing the number of sense amplifiers used for the semiconductor memory device.

In accordance with an aspect of the present invention, the above and other objects can be accomplished by the provision of a semiconductor memory device comprising a memory cell array including a plurality of word lines connected respectively to a plurality of memory cell blocks, each of which is composed of a plurality of memory cells, in a row direction of the memory cells, and a plurality of pairs of bit lines connected respectively to the plurality of memory cell blocks in a column direction of the memory cells; and a plurality of sense amplifier arrays, each of which includes a plurality of sense amplifiers, each of which is connected to bit lines and complementary bit lines of the plurality of pairs of bit lines, for sensing a potential difference between the bit lines and the complementary bit lines, wherein each of the plurality of sense amplifiers is connected to a first pair of bit lines of an upper memory cell block adjacent to the sense amplifier, a second pair of bit lines of a lower memory cell block adjacent to the sense amplifier, a pair of bit lines of at least one upper memory cell not adjacent to the sense amplifier, and a pair of bit lines of at least one lower memory cell not adjacent to the sense amplifier.

Preferably, each of the plurality of sense amplifiers is connected to the first pair of bit lines of the upper memory cell block adjacent to the sense amplifier, the second pair of bit lines of the lower memory cell block adjacent to the sense amplifier, a third pair of bit lines of a next-upper memory cell not adjacent to the sense amplifier, and a fourth pair of bit lines of a next-upper memory cell not adjacent to the sense amplifier.

Preferably, a switching device is provided between each bit line of the pairs of bit lines and the sense amplifier and between each complementary bit line of the pairs of bit lines and the sense amplifier, respectively, and a pair of switching devices is operated according to control signals such that only one pair of bit lines of the plurality of pairs of bit lines is selected to be electrically connected to the sense amplifier.

Preferably, the switching device comprises an NMOS transistor or a PMOS transistor.

Preferably, a metal line is used for connection between the sense amplifier and the pairs of bit lines of the memory cell blocks not adjacent to the sense amplifier, the metal line being isolated from the first and second pairs of bit lines.

In accordance with another aspect of the present invention, the above and other objects can be accomplished by the provision of a connecting method of a sense amplifier of a semiconductor memory device comprising a memory cell array including a plurality of word lines connected respectively to a plurality of memory cell blocks, each of which is composed of a plurality of memory cells, in a row direction of the memory cells, and a plurality of pairs of bit lines connected respectively to the plurality of memory cell blocks in a column direction of the memory cells; and a plurality of sense amplifier arrays, each of which includes a plurality of sense amplifiers, each of which is connected to bit lines and complementary bit lines of the plurality of pairs of bit lines, for sensing a potential difference between the bit lines and the complementary bit lines, wherein each of the plurality of sense amplifiers is connected to a first pair of bit lines of an upper memory cell block adjacent to the sense amplifier, a second pair of bit lines of a lower memory cell block adjacent to the sense amplifier, a pair of bit lines of at least one upper memory cell not adjacent to the sense amplifier, and a pair of bit lines of at least one lower memory cell not adjacent to the sense amplifier.

Preferably, each of the plurality of sense amplifiers is connected to the first pair of bit lines of the upper memory cell block adjacent to the sense amplifier, the second pair of bit lines of the lower memory cell block adjacent to the sense amplifier, a third pair of bit lines of a next-upper memory cell not adjacent to the sense amplifier, and a fourth pair of bit lines of a next-upper memory cell not adjacent to the sense amplifier.

Preferably, a switching device is provided between each bit line of the pairs of bit lines and the sense amplifier and between each complementary bit line of the pairs of bit lines and the sense amplifier, respectively, and a pair of switching devices is operated according to control signals such that only one pair of bit lines of the plurality of pairs of bit lines is selected to be electrically connected to the sense amplifier.

Preferably, the switching device comprises an NMOS transistor or a PMOS transistor.

Preferably, a metal line is used for connection between the sense amplifier and the pairs of bit lines of the memory cell blocks not adjacent to the sense amplifier, the metal line being isolated from the first and second pairs of bit lines.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, a connecting method of a sense amplifier and a semiconductor memory device using the same method, according to preferred embodiments of the present invention, will be described in detail with reference to the accompanying drawings.

A semiconductor memory device according to the present invention includes a memory cell array and a plurality of sense amplifiers, wherein each of the plurality of sense amplifiers is connected to first and second pairs of bit lines of upper and lower memory cell blocks adjacent to the sense amplifier, and pairs of bit lines of at least one upper and lower memory cell not adjacent to the sense amplifier.

In more detail, each sense amplifier is connected to bit lines and complementary bit lines of memory cell blocks immediately adjacent above and below the sense amplifier. In addition, each sense amplifier is connected to bit lines and complementary lines of upper and lower memory cell blocks not adjacent to the sense amplifier beyond the adjacent memory cell blocks.

Accordingly, if a voltage charge-shared by any one of the pairs of bit lines is to be sensed, control signals are applied to gate electrodes of switching devices such that only a switching device provided between the pair of bit lines and the sense amplifier is turned on, and switching devices provided between the sense amplifier and pairs of bit lines of other memory cell blocks connected to the sense amplifier are turned off. When one pair of bit lines is selected, the sense amplifier senses a potential difference between a bit line and a complementary bit line of the pair of bit lines and amplifies the sensed potential difference to full-logic level.

The semiconductor memory device of the present invention is formed by the structure of connection of the sense amplifier with the pairs of bit lines.

Hereinafter, the present invention will be described in more detail by way of preferred embodiments. The following preferred embodiments are exemplified for the purpose of explaining the principles of the present invention, without limiting the claims of the present invention.

Figure 1:
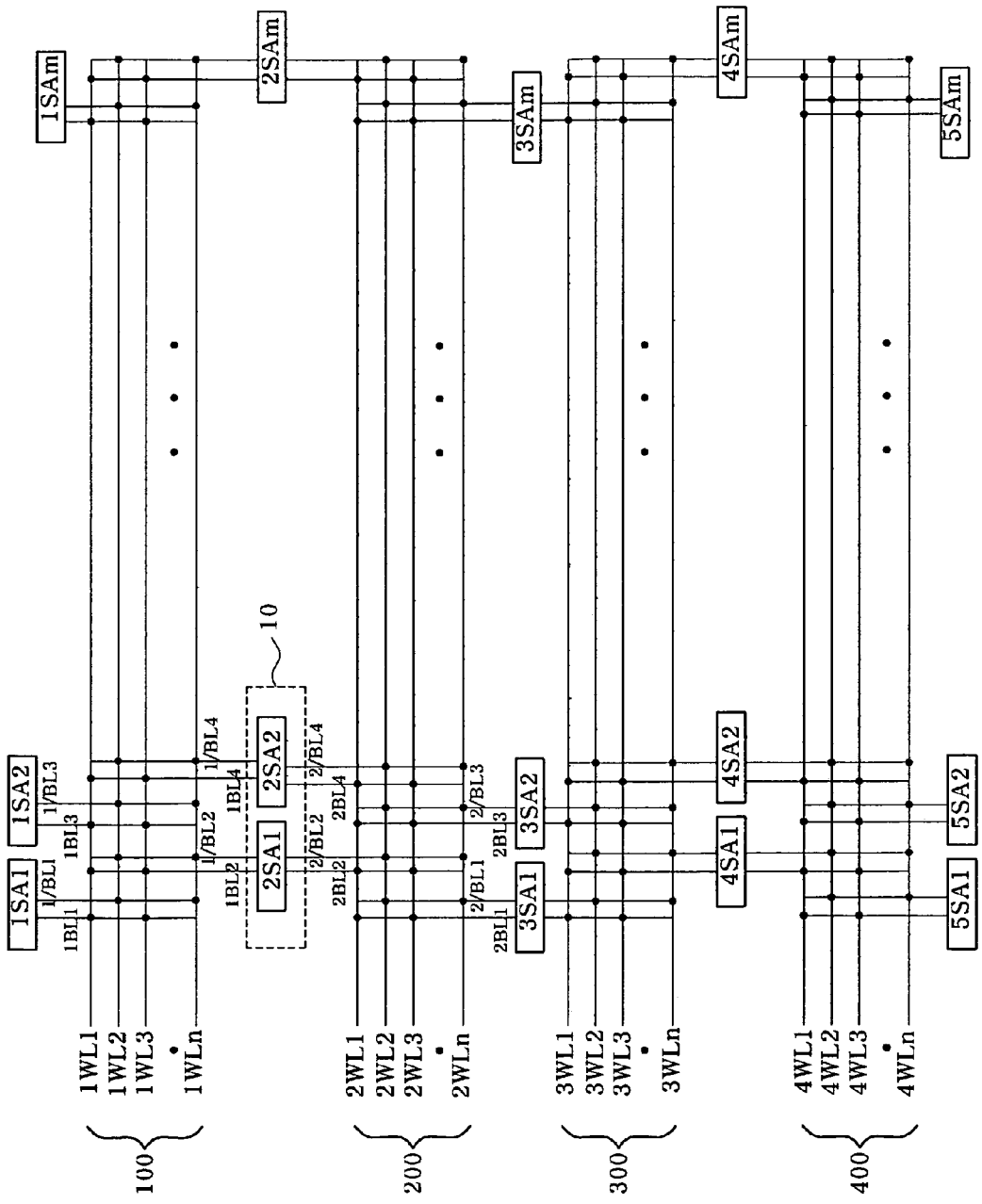
FIG. 1 is a diagram illustrating a conventional semiconductor memory device and a conventional connecting method of a sense amplifier.
Figure 2:
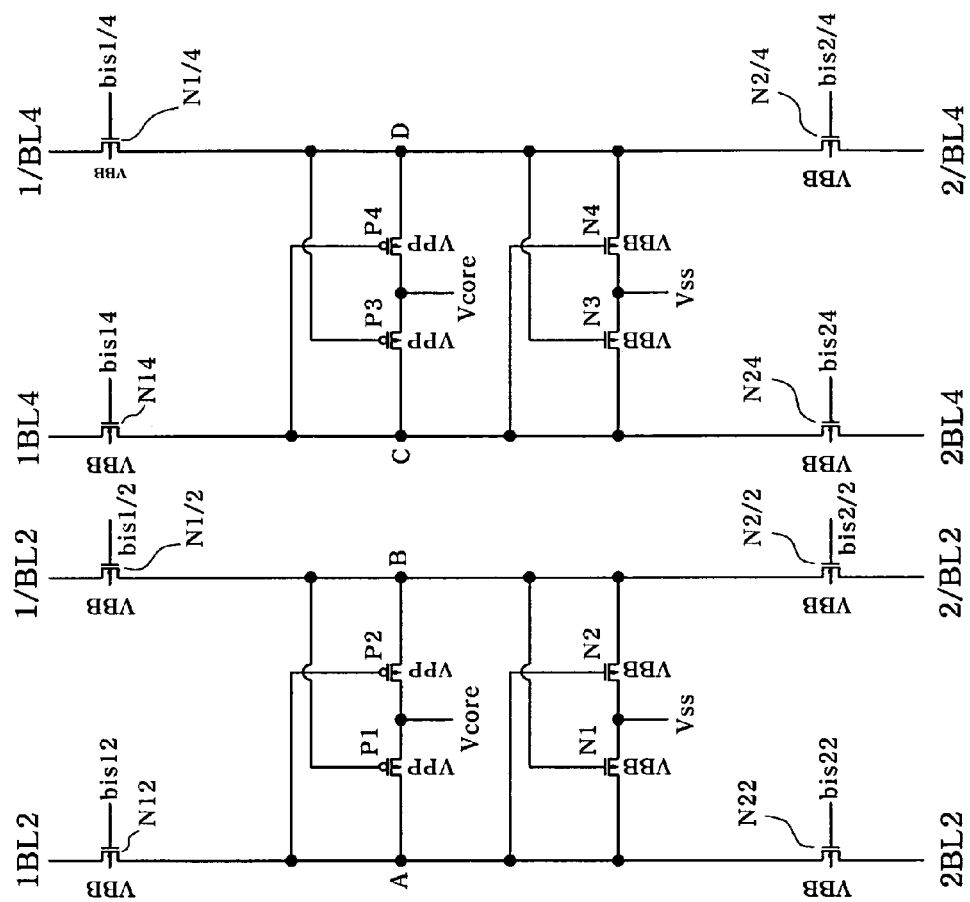
FIG. 2 is a diagram illustrating a conventional circuit configuration of a sense amplifier of a semiconductor memory device and a connecting method of the sense amplifier.
Figure 3:
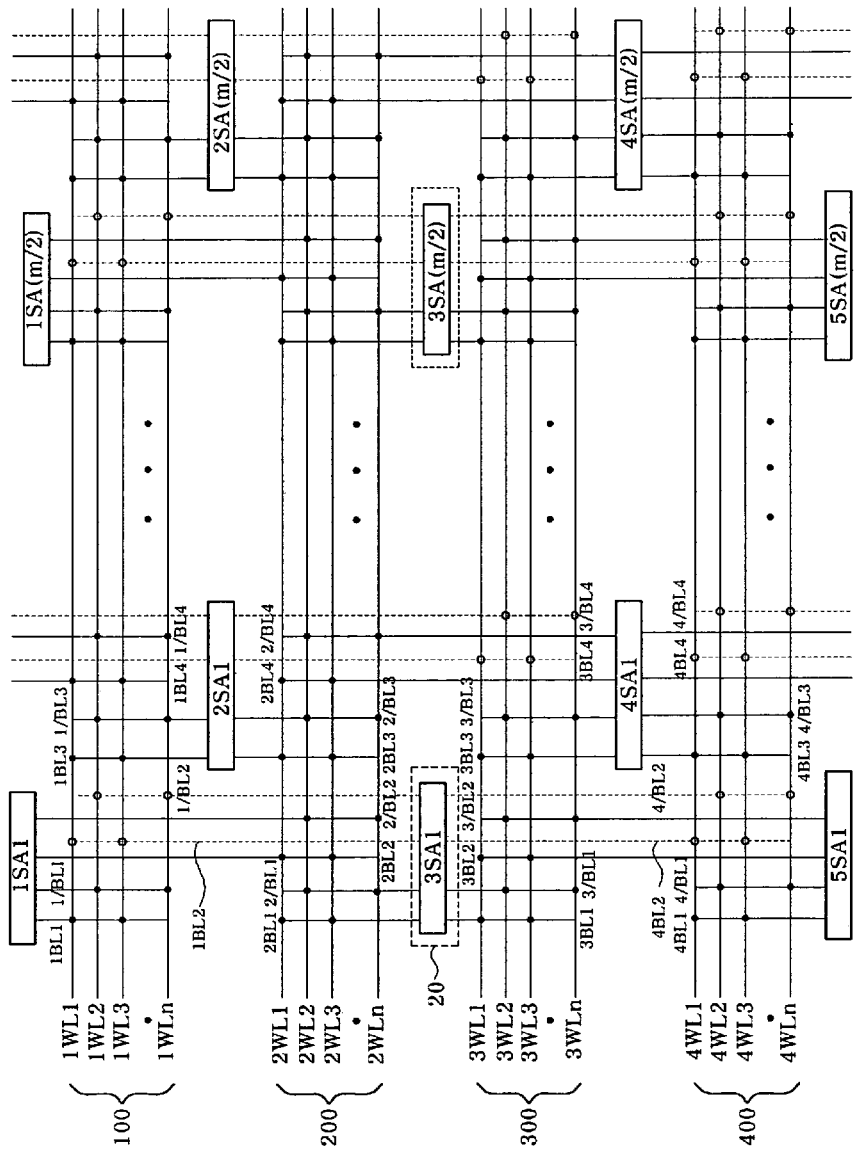
FIG. 3 is a diagram illustrating a semiconductor memory device and a connecting method of a sense amplifier, according to an embodiment of the present invention.

FIG. 3 is a diagram illustrating the structure of a semiconductor memory device according to an embodiment of the present invention.

Referring to FIG. 3, the semiconductor memory device of the present invention comprises a memory cell array including a plurality of word lines xWLy connected respectively to a plurality of memory cell blocks 110, 200, 300, 400, . . . , each of which is composed of a plurality of memory cells, in a row direction of the memory cells, and a plurality of pairs of bit lines, each of which is composed of a bit line xBLy and a complementary bit line x/Bly, connected respectively to the plurality of memory cell blocks in a column direction of the memory cells; and a plurality of sense amplifier arrays, each of which includes a plurality of sense amplifiers xSAy, each of which is connected to the bit line xBLy and the complementary bit line x/BLy, for sensing a potential difference between the bit line xBLy and the complementary bit line x/Bly. Where, 'x' and 'y' are random numbers in the same way as in the description of the related art. In the semiconductor memory device of the present invention, the sense amplifier xSAy is connected to pairs of bit lines xBLy and x/Bly of memory cell blocks immediately adjacent above and below the sense amplifier, and pairs of bit lines xBLy and x/Bly of upper and lower memory cell blocks not adjacent to the sense amplifier beyond the adjacent memory cell blocks.

For example, in FIG. 3, a sense amplifier 3SA1 is connected to a pair of bit lines 2BL1 and 2/BL1 of an upper memory cell block 200 adjacent to the sense amplifier 3SA1 and a pair of bit lines 3BL1 and 3/BL1 of a lower memory cell block 300 adjacent to the sense amplifier 3SA1. In addition, the sense amplifier 3SA1 is connected to a pair of bit lines 1BL2 and 1/BL2 of a next-upper memory cell block 100 not adjacent to the sense amplifier 3SA1 and a pair of bit lines 4BL2 and 4/BL2 of a next-upper memory cell block 400 not adjacent to the sense amplifier 3SA1. In this case, the number of pairs of bit lines covered by one sense amplifier xSAy is twice that of the conventional techniques. Accordingly, the number of sense amplifiers required for the semiconductor memory device is decreased by half compared to that in the conventional techniques, thus allowing high integration and miniaturization of the semiconductor memory device. In FIG. 3, pairs of bit lines indicated by dotted lines are pairs of bit lines of memory cell blocks not adjacent to the sense amplifier 3SA1.

On the other hand, if necessary, each sense amplifier may be connected to pairs of bit lines of other memory cell blocks next to the next-upper and next-lower memory cell blocks.

Herein, a metal line can be used for connection between the sense amplifier xSAy and the pairs of bit lines of the memory cell blocks not adjacent to the sense amplifier. The metal line is isolated from the sense amplifier xSAy and the pairs of bit lines of the memory cell blocks adjacent to the sense amplifier xSAy.

Figure 4:
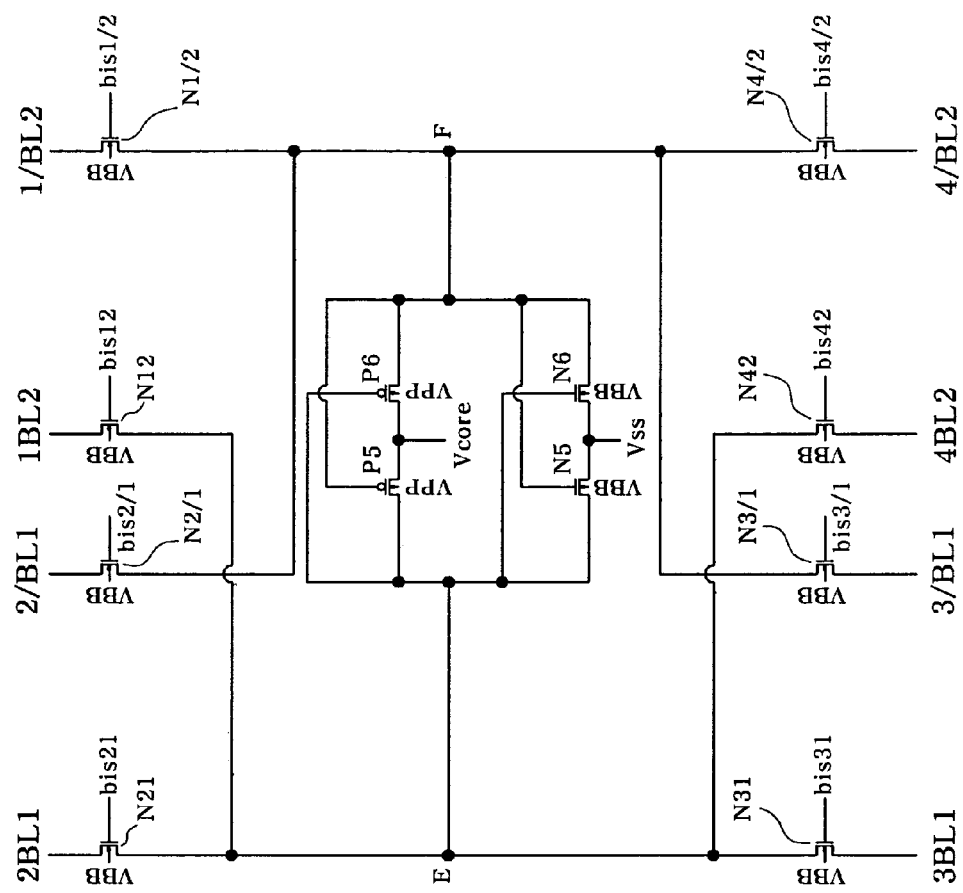
FIG. 4 is a diagram illustrating a circuit configuration of a sense amplifier of a semiconductor memory device and a connecting method of the sense amplifier, according to an embodiment of the present invention.

FIG. 4 is a diagram illustrating a circuit configuration of a portion 20 indicated by a dotted line. Now, with reference to FIG. 4, sensing and amplifying operation of the sense amplifier according to the present invention will be described.

Referring to FIG. 4, if a voltage charge-shared by a bit line 2BL1 and a complementary bit line 2/BL1 is to be sensed, NMOSs N21 and N2/1, which are a switching device, are tuned on by applying control signals bis21 and bis2/1 of high level to gate electrodes of the NMOSs N21 and N2/1, respectively, such that only the pair of bit lines is selected.

At this time, other switching devices N12, N1/2, N31, N3/1, N42, and N4/2 except the NMOSs N21 and N2/1 are turned off by applying control signals of low level to gate electrodes of other switching devices in order to prevent charges from being introduced from pairs of bit lines to other switching devices.

Next, a sense amplifier 3SA1 senses data of memory cells transferred to the pair of bit lines 2BL1 and 2/BL1 and amplifies the sensed data to full-logic level. More specifically, if a level of the data transferred from the bit line 2BL1 is sensed to have a high level, an NMOS N6 is turned on, and accordingly, a potential at a node F is shifted to a ground potential Vss. This ground potential Vss at the node F is applied to a gate of a PMOS P5, thus turning on the PMOS P5. Accordingly, a potential at a node E is shifted from a high level to a core potential Vcore level. On the contrary, if the level of the data transferred from the bit line 2BL1 is sensed to have a low level, a PMOS P6 is turned on, and accordingly, the potential at the node F is shifted to the core potential Vcore. This core potential Vcore at the node F is applied to a gate of an NMOS N5, thus turning on the NMOS N5. Accordingly, the potential at the node E is shifted from a low level to a ground potential Vss level.

In addition, if a voltage charge-shared by a pair of bit lines 1BL2 and 1/BL2 is to be sensed, NMOSs N12 and N1/2 are tuned on by applying control signals bis12 and bis1/2 of high level to gate electrodes of the NMOSs N12 and N1/2, and other control signals bis21, bis2/1, bis31, bis3/1, bis42, and bis4/2 of low level are applied to gate electrodes of respective NMOS transistors. Thereafter, the same operation as described above is performed.

With the configuration as described above, while the number of pairs of bit lines covered by one sense amplifier is increased, compared to that in the conventional techniques, the same operation as the conventional sense amplifiers can be performed. According, the number of sense amplifiers required for the semiconductor memory device is decreased, compared to that in the conventional techniques, thus allowing high integration and miniaturization of the semiconductor memory device.

As apparent from the above description, according to the present invention, by increasing the number of bit lines and complementary bit lines covered by each sense amplifier by at least two times, compared to the conventional techniques, the number of sense amplifiers required for the semiconductor memory device is decreased by at least half, compared to the convention techniques, thus allowing high integration and miniaturization of the semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
    a memory cell array including a plurality of word lines connected respectively to a plurality of memory cell blocks, each of which is composed of a plurality of memory cells, in a row direction of the memory cells, and a plurality of pairs of bit lines connected respectively to the plurality of memory cell blocks in a column direction of the memory cells; and
    a plurality of sense amplifier arrays, each of which includes a plurality of sense amplifiers, each of which is connected to bit lines and complementary bit lines of the plurality of pairs of bit lines, for sensing a potential difference between the bit lines and the complementary bit lines,
    wherein each of the plurality of sense amplifiers is connected to a first pair of bit lines of an upper memory cell block adjacent to the sense amplifier, a second pair of bit lines of a lower memory cell block adjacent to the sense amplifier, a pair of bit lines of at least one upper memory cell block not adjacent to the sense amplifier, and a pair of bit lines of at least one lower memory cell block not adjacent to the sense amplifier,
    and wherein each sense amplifier array is disposed between two memory cell blocks adjacent to each other, and sense amplifiers of a sense amplifier array are disposed in zigzags with sense amplifiers of another sense amplifier array adjacent thereto.

2. The semiconductor memory device as set forth in claim 1, wherein each of the plurality of sense amplifiers is connected to the first pair of bit lines of the upper memory cell block adjacent to the sense amplifier, the second pair of bit lines of the lower memory cell block adjacent to the sense amplifier, a third pair of bit lines of a next-upper memory cell block not adjacent to the sense amplifier, and a fourth pair of bit lines of a next-lower memory cell block not adjacent to the sense amplifier.

3. The semiconductor memory device as set forth in claim 1, wherein a switching device is provided between each bit line of the pairs of bit lines and the sense amplifier and between each complementary bit line of the pairs of bit lines and the sense amplifier, respectively, and
    wherein a pair of switching devices is operated according to control signals such that only one pair of bit lines of the plurality of pairs of bit lines is selected to be electrically connected to the sense amplifier.

4. The semiconductor memory device as set forth in claim 3, wherein the switching device comprises an NMOS transistor or a PMOS transistor.

5. The semiconductor memory device as set forth in claim 3, wherein a metal line is used for connection between the sense amplifier and the pairs of bit lines of the memory cell blocks not adjacent to the sense amplifier, the metal line being isolated from the first and second pairs of bit lines.

6. The semiconductor memory device as set forth in claim 1, wherein a metal line is used for connection between the sense amplifier and the pairs of bit lines of the memory cell blocks not adjacent to the sense amplifier, the metal line being isolated from the first and second pairs of bit lines.

7. A connection scheme of sense amplifiers in a semiconductor memory device comprising:
    a memory cell array including a plurality of word lines connected respectively to a plurality of memory cell blocks, each of which is composed of a plurality of memory cells, in a row direction of the memory cells, and a plurality of pairs of bit lines connected respectively to the plurality of memory cell blocks in a column direction of the memory cells; and
    a plurality of sense amplifier arrays, each of which includes a plurality of sense amplifiers, each of which is connected to bit lines and complementary bit lines of the plurality of pairs of bit lines, for sensing a potential difference between the bit lines and the complementary bit lines,
    wherein each of the plurality of sense amplifiers is connected to a first pair of bit lines of an upper memory cell block adjacent to the sense amplifier, a second pair of bit lines of a lower memory cell block adjacent to the sense amplifier, a pair of bit lines of at least one upper memory cell block not adjacent to the sense amplifier, and a pair of bit lines of at least one lower memory cell block not adjacent to the sense amplifier, and wherein each sense amplifier array disposed between two memory cell blocks adjacent to each other, and sense amplifiers of a sense amplifier array are disposed in zigzags with another sense amplifier array adjacent thereto.

8. The connection scheme as set forth in claim 7, wherein each of the plurality of sense amplifiers is connected to the first pair of bit lines of the upper memory cell block adjacent to the sense amplifier, the second pair of bit lines of the lower memory cell block adjacent to the sense amplifier, a third pair of bit lines of a next-upper memory cell block not adjacent to the sense amplifier, and a fourth pair of bit lines of a next-lower memory cell block not adjacent to the sense amplifier.

9. The connection scheme as set forth in claim 7, wherein a switching device is provided between each bit line of the pairs of bit lines and the sense amplifier and between each complementary bit line of the pairs of bit lines and the sense amplifier, respectively, and wherein a pair of switching devices is operated according to control signals such that only one pair of bit lines of the plurality of pairs of bit lines is selected to be electrically connected to the sense amplifier.

10. The connection scheme as set forth in claim 9, wherein the switching device comprises an NMOS transistor or a PMOS transistor.

11. The connection scheme as set forth in claim 9, wherein a metal line is used for connection between the sense amplifier and the pairs of bit lines of the memory cell blocks not adjacent to the sense amplifier, the metal line being isolated from the first and second pairs of bit lines.

12. The connection scheme as set forth in claim 7, wherein a metal line is used for connection between the sense amplifier and the pairs of bit lines of the memory cell blocks not adjacent to the sense amplifier, the metal line being isolated from the first and second pairs of bit lines.

* * * * *